United States Patent
Godin et al.

[11] Patent Number: 6,067,709
[45] Date of Patent: May 30, 2000

[54] APPLYING ENCAPSULATING MATERIAL TO SUBSTRATES

[75] Inventors: Richard Godin, Lunenburg, Mass.; Steven James Corbett, Montville, N.J.; Kenneth Burton Gilleo, Erwinne, Pa.; Alden Johnson, Marshfield, Mass.

[73] Assignee: MPM Corporation, Franklin, Mass.

[21] Appl. No.: 08/605,874

[22] Filed: Feb. 23, 1996

[51] Int. Cl.$^7$ .................................................. H05K 3/30
[52] U.S. Cl. .......................... 29/841; 101/123; 181/120; 181/213; 427/209
[58] Field of Search .................................. 101/123, 127; 118/120, 213; 174/250; 437/209, 224; 29/841

[56] References Cited

U.S. PATENT DOCUMENTS

| | | | |
|---|---|---|---|
| 4,218,701 | 8/1980 | Shirasaki | 357/72 |
| 4,779,529 | 10/1988 | Ericsson | 101/123 |
| 4,781,114 | 11/1988 | Ericsson | 101/123 |
| 4,843,036 | 6/1989 | Schmidt et al. | 437/224 |
| 5,359,928 | 11/1994 | Blessington et al. | 101/128.4 |
| 5,386,342 | 1/1995 | Rostoker | 361/749 |
| 5,436,203 | 7/1995 | Lin | 437/209 |
| 5,522,929 | 6/1996 | Erdmann | 118/120 |
| 5,553,538 | 9/1996 | Freitag | 101/123 |
| 5,606,911 | 3/1997 | Cane | 101/127 |
| 5,631,557 | 5/1997 | Davidson | 324/174 |
| 5,660,632 | 8/1997 | Volpe, Jr. et al. | 118/213 |
| 5,694,843 | 12/1997 | Chen | 101/123 |
| 5,700,981 | 12/1997 | Tuttle et al. | 174/250 |
| 5,720,100 | 2/1998 | Skipor et al. | 29/840 |
| 5,804,881 | 9/1998 | Wille et al. | 257/780 |
| 5,863,970 | 1/1999 | Ghoshal et al. | 523/434 |

FOREIGN PATENT DOCUMENTS

| | | |
|---|---|---|
| 63-053955 | 3/1988 | Japan . |
| 01082639 | 3/1989 | Japan . |
| 03181142 | 8/1991 | Japan . |
| WO95/01613 | 1/1995 | WIPO . |

OTHER PUBLICATIONS

1992 Proceedings 42nd Electronic Components & Technology Conference, Okuno et al, p. 783–786, May 1992.

Surface Mount Technology Based on a new Aramid/Epoxy Laminate, Okuno et al, p. 117–121, Feb. 1988.

New Packaging of a Chip on a board by a Unique Printing Method, Okuno et al, p. 73–77, Feb. 1992.

Unique Exoxy Resin and Printing Encapsulation . . . , Okuno et al, p. 143–151, 1994.

Okuno, Atsushi et al., "Unique Epoxy Resin and Printing Encapsulation System (PES) for Advanced Multichip Modules, PLCC, BGA, PGA, TAB, COB, and Flip–Chip", Int. J. Microcircuits and Electronic Packaging, 17:2, 1994.

Okuno, Atushi, et al., "Printing Encapsulation Systems (PES) of Advanced Multichip Module & COB Device", 1992 Proceedings, 42nd Electronic Components & Technology Conference, May 18–20, 1992.

Okuno, Atushi, et al., "New Packaging of a Chip on a Board by a Unique Printing Method", IEEE Transactions on Components, Hybrids, and Manufacturing Technology, Feb. 1992, 15:1.

Tsunashima, Eiichi et al., "Surface Mount Technology Based on a New Aramid/Epoxy Laminate", Fifth IEEE/CHMT International Electronic Manufacturing Technology Symposium, Oct. 10–12, 1998.

*Primary Examiner*—Lee Young
*Assistant Examiner*—Kevin G. Vereene
*Attorney, Agent, or Firm*—Mintz, Levin, Cohn, Ferris, Glovsky and Popeo, P.C.

[57] ABSTRACT

Providing encapsulated electronic components on a circuit board by providing dams on a circuit board around areas on which respective electronic components will be mounted, mounting the respective electronic components within the dams on the circuit board, and printing encapsulating material through a stencil in order to provide deposits of encapsulating material over the electronic components and within the dams.

5 Claims, 1 Drawing Sheet

APPLYING ENCAPSULATING MATERIAL TO SUBSTRATES

BACKGROUND OF THE INVENTION

The invention relates to applying encapsulating material to substrates, e.g., printed circuit boards.

Encapsulating material is generally deposited over electronic components mounted on a printed circuit board using a syringe-type dispenser moved over the board. Often dams of higher viscosity material are first deposited around areas where components will be mounted in an initial procedure, and then the areas within the dams will be filled in after the components have been mounted and electrically connected. Okuno, et al., "Unique Epoxy Resin and Printing Encapsulation System (PES) for Advanced Multichip Modules, PLCC, BGA, PGA, TAB, COB, and Flip-Chip," International J. of Microcircuits and Electronic Packaging, Vol. 17, No. 2, Second Quarter 1994, pages 143–151, which is hereby incorporated by reference, describes printing encapsulating material over components mounted on a circuit board using a stencil printing machine in a one-step process.

SUMMARY OF THE INVENTION

The invention features, in general, encapsulating electronic components on a circuit board by providing dams on the circuit board around areas on which respective electronic components will be mounted, mounting the electronic components within the dams on the circuit board, and printing encapsulating material through a stencil in order to provide deposits of encapsulating material over the electronic components within the dams. The dams help to retain the encapsulating material, acting as a gasket.

The invention also features a stencil that has openings that are smaller at an upper surface than at a lower surface. An advantage of this configuration is that it provides a space to receive dams to facilitate depositing later deposited material, e.g., having a lower viscosity, within the dams. A preferred use for the stencil is in depositing encapsulating material within dams on a circuit board.

In preferred embodiments, the stencil openings are larger than the outer perimeters of the dams at the stencil's lower surface, and are smaller than the inner perimeters of the dams at the stencil's upper surface. The stencil openings have recessed portions at the lower surface to receive the dams. The dams and recessed portions are less than one-half the thickness of the stencil. The recessed portions are at least 4 mils in height to a maximum of 30 mils, most preferably about 10 mils in height. The stencil is at least 10 or 11 mils in thickness and up to 60 mils in thickness. The dams are provided on the circuit board by printing.

Other advantages and features of the invention will be apparent from the following description of the preferred embodiment thereof and from the claims.

DESCRIPTION OF THE PREFERRED EMBODIMENTS

Figure 1:
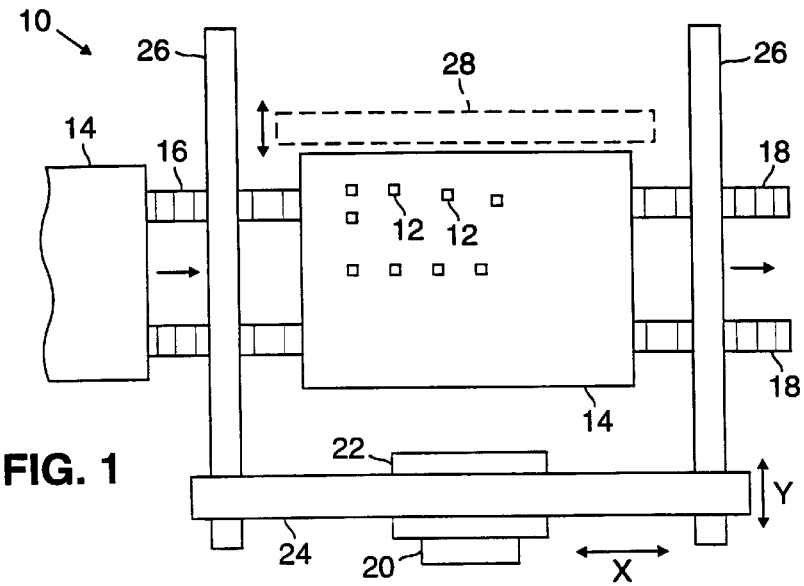
FIG. 1 is a partial, diagrammatic plan view of an printer used in practicing the invention.

Referring to FIG. 1, there are shown some of the components of printer 10 used to apply encapsulating material deposits 12 over electronic components mounted on circuit boards 14. The printer is similar to the type of printer described in Freeman U.S. Reissue Pat. No. 34,615 and commercially available under the Ultraprint 2000 trade designation from MPM Corporation, Franklin, Mass., both of which are hereby incorporated by reference. The printer can also be used to print solder and adhesive, and can employ a screen or a stencil, both of which are employed in applying encapsulating material deposits 12.

As is shown in FIG. 1, printer 10 includes tractor feed mechanism 16 to supply the boards 14 to a central area where the boards are supported from below (by components not shown). Tractor mechanism 18 is used to remove processed boards. The printer also includes camera 20 carried on carriage 22, which is movable in an X direction along frame 24, which is a linear X-axis of motion. Frame 24 in turn is movable in a Y direction along tracks 26, which is a linear Y-axis of motion. Printer 10 also includes squeegee 28 positioned above board 14 and shown in phantom in FIG. 1.

Figure 2:
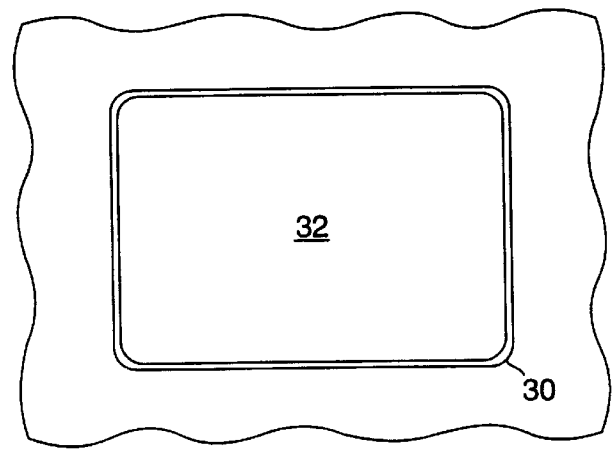
FIG. 2 is a plan view showing a dam applied to a substrate by the FIG. 1 printer in an initial procedure.

During a production run, boards 14 are automatically moved into position by tractor feed mechanism 16, engaged by underboard support components (not shown) and raised into position directly under a screen (not shown) used to print dams 30. A single dam 30 is shown in FIG. 2 around area 32 on which an electronic component will be mounted. The size of area 32 depends upon the size of the component; a typical area might be ⅜" wide by ¾" long. Epoxy encapsulating material of a higher viscosity than the encapsulating material that will later be deposited within the dam is deposited on the upper surface of the screen in front of squeegee 28. Squeegee 28 then moves across the upper surface of the screen, pushing the encapsulating material in front of it on the screen surface, and the encapsulating material is forced through the openings into contact with the surface of board 14, forming dam 30. The printed dam 30 is about 7 or 8 mils wide and about 8 mils high. The printed board 14 is then lowered and removed by tractor mechanism 18, and the next board 14 is moved into position for printing of dams 30.

The dams 30 are then thermally cured, and electronic components are mounted at respective areas 32 and electrically connected to the circuit board 14.

Figure 3:
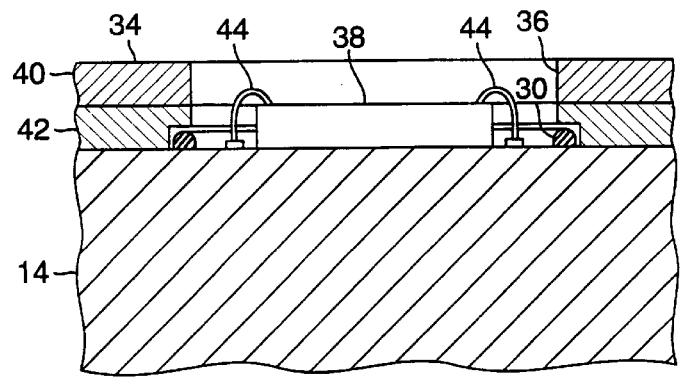
FIG. 3 is a partial sectional view showing a stencil used to apply encapsulating material within the FIG. 2 dam using the FIG. 1 printer.

The boards 14 with dams 30 and electronic components are then directed to the same or a different printer 10 employing a stencil with openings aligned with dams 30. FIG. 3 shows a portion of stencil 34 and circuit board 14 at an opening 36 aligned electronic component 38 and dam 30 therearound. Stencil 34 is made of two 20 mil thick layers 40, 42 of stainless steel. The stencil thickness must be sufficient to clear tops of wire loops 44 that connect component 38 to the substrate. The stencil could be made of a single sheet of stainless steel that has been machined to provide a larger opening at the bottom than at the top. The stencil could also be made of other materials such as brass, steel, and plastic.

Opening 36 in upper layer 40 is slightly smaller than the inner edge of dam 30. Opening 36 is the same size at the top half of lower layer 42, and extends outward 10 mils at the bottom half of lower layer 42 in order to define a recess to receive dam 30. Stencil thicknesses can vary from about 19 mils to 60 mils; recess heights can vary from 4 mils to 30 mils, and other shapes (e.g., angled surfaces) could be used in place of the stepped recesses.

Epoxy encapsulating material is deposited on the upper surface of stencil 34 in front of squeegee 28, which then moves across the upper surface of the stencil, pushing encapsulating material in front of it, and forcing the encapsulating material through openings 36 into contact with dams 30, components 38, and circuit board 14. The encapsulating material fills openings 36, covering components 38 and wires 44.

The encapsulating material may consist of a combination of one or more liquid or semi-solid epoxy resins cross-linked via reaction with dicyandiamide or a liquid anhydride, the cross-linking reaction being catalyzed by reacting with an imidazol complex. The encapsulant formulation should be a free flowing liquid at room temperature, and the viscosity should typically range from 60,000 centipoise to 180,000 centipoise at low shear rates. The flow characteristics are important to ensure complete encapsulation of fine interconnect wires without the entrapment of small air pockets, and reactive diluents can be added to the encapsulation formulation to optimize the material flow characteristics. Solid, inorganic fillers can also be included to reduce the expansion coefficient of the cured encapsulant.

The board is then lowered, leaving deposits of encapsulating material over the electronic components. Dams 30 are sufficient to keep the deposited encapsulating material in place. The boards are removed by tractor mechanism 18, and the pads of encapsulating material are then thermally cured. The encapsulation material cures in 30 minutes to 120 minutes at temperatures ranging from 100° C. to 200° C. Typical process conditions are 160° C. for 60 minutes.

Other embodiments of the invention are within the scope of the claims.

What is claimed is:

1. A method of providing at least one encapsulated electronic component on a circuit board comprising:

providing a dam on a circuit board around an area on which the electronic component will be mounted, mounting said respective electronic component within said dam on said circuit board, providing a stencil for printing encapsulating material, printing encapsulating material through the stencil in order to provide deposits of encapsulating material over the electronic component within said dam, wherein said step of providing a stencil includes a stencil with an upper and lower stencil surface and which has an opening that is smaller at the upper stencil surface than at the lower stencil surface and wherein the opening at said lower stencil surface is larger than the outer perimeter of said dam, and further wherein the opening at said lower stencil surface has a recessed portion to receive said dam.

2. The method of claim 1 wherein said opening at the upper stencil surface is smaller than the inner perimeter of said dam.

3. The method of claim 1 wherein said dams are less than or equal to one-half the thickness of said stencil.

4. The method of claim 1 wherein in said dams are provided on said circuit board by printing.

5. The method of claim 1 further comprising curing said encapsulating material.

\* \* \* \* \*